Figure 1:
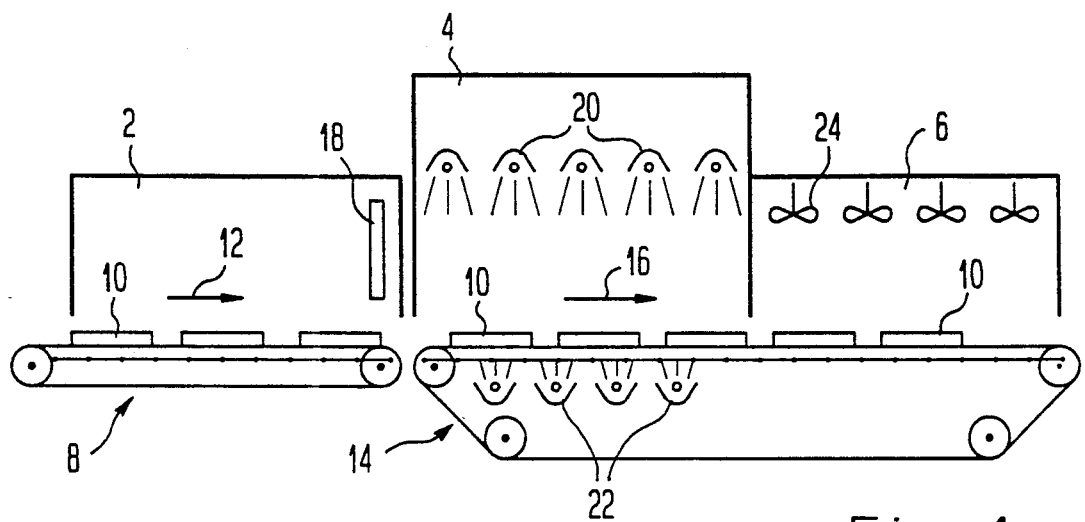

United States Patent [19]

Volk

[11] Patent Number: 5,259,546
[45] Date of Patent: Nov. 9, 1993

[54] PROCEDURE AND ARRANGEMENT FOR REFLOW-SOLDERING ELECTRONIC COMPONENTS ONTO A PRINTED BOARD

[75] Inventor: Helmut Volk, Paderborn, Fed. Rep. of Germany

[73] Assignee: Siemens Nixdorf Informationssysteme AG, Paderborn, Fed. Rep. of Germany

[21] Appl. No.: 702,266

[22] Filed: May 17, 1991

[30] Foreign Application Priority Data

May 21, 1990 [DE] Fed. Rep. of Germany ....... 4016366

[51] Int. Cl.$^5$ ............................................. H05K 3/34
[52] U.S. Cl. ................................. 228/102; 228/180.1; 228/232; 228/8
[58] Field of Search ..................... 228/102, 180.1, 200, 228/232, 240, 8, 42, 46

[56] References Cited

U.S. PATENT DOCUMENTS

| | | | |
|---|---|---|---|
| 3,882,596 | 5/1975 | Kendziora et al. | 228/232 |
| 4,446,358 | 5/1984 | Comerford et al. | 228/232 |
| 4,632,291 | 12/1986 | Rahn et al. | 228/9 |

FOREIGN PATENT DOCUMENTS

0325451A1  7/1989  European Pat. Off. .

*Primary Examiner*—Samuel M. Heinrich
*Attorney, Agent, or Firm*—Varnum, Riddering, Schmidt & Howlett

[57] ABSTRACT

Reflow-soldering of electronic components with differing heat capacities onto electronic circuit boards is accomplished by conveying the printed circuit board assemblies through a preheating chamber and a soldering chamber by means of conveyors operating at independently controlled speeds. To ensure that solder for components of large heat capacity is properly melted and smaller heat capacity components are not overheated, the circuit board assembly and components are advanced through the heating chamber at a rate of speed sufficient to allow the larger heat capacity components to just attain a preheat temperature. The assembly is subsequently conveyed through the soldering chamber at a rate of speed sufficient to just finish melting the solder for the larger heat capacity components as the assembly reaches the end of the soldering chamber. The ambient temperature within the soldering chamber is maintained at approximately 170° C. by the controlled removal of hot air and supplying fresh air to the soldering chamber to keep the temperature in the soldering chamber adjusted to a maximum temperature in the vicinity of the melting temperature of the solder and preferably slightly below that temperature.

21 Claims, 2 Drawing Sheets

PROCEDURE AND ARRANGEMENT FOR REFLOW-SOLDERING ELECTRONIC COMPONENTS ONTO A PRINTED BOARD

The present invention concerns a procedure for reflow-soldering electronic components onto a printed board, as well as an arrangement for implementing this procedure.

In reflow-soldering, solder is applied to the printed board at the places that are to receive an electronic component. The components are laid on the solder, which is in solid state. The printed-board assemblies are then heated until the solder melts, and subsequently cooled again, whereupon the solder hardens. In this procedure, the electronic components are also heated to relatively high temperatures, so that the solder bonds with the components. In known procedures, in order to minimize heat stress on the components, the printed-board assemblies are first heated in a preheating zone to a preheat temperature that is below the melting point of the solder, and then briefly exposed to a temperature at which the solder melts (EP 0 325 451 A1). In the process, the printed boards pass continuously through the preheating zone and then through the soldering zone on a conveyor.

The temperatures are controlled through regulation of the heat output in the individual zones, which is set so that the desired temperatures are reached in the preheating zone on the one hand and the soldering zone on the other, during the exposure time determined by the conveyance speed.

It has become evident that this regulation is not optimal, first of all because fine gradation of the heat output involves costly technology, and secondly because adjusting the temperature by changing the heat output works relatively sluggishly. Since the exposure times in the two zones are predetermined and interdependent, based on the speed of the conveyor, the heat output in the respective zones must be adjusted so that the temperature required for the each procedure is reached in each of these zones. Particularly in the case of thick boards bearing both large components with large heat capacities and smaller components with correspondingly smaller heat capacities, the temperatures must often be set so high to ensure flawless preheating and soldering of the large components, that the smaller components are in danger of overheating; on the other hand, a lower temperature that would prevent overheating of the smaller components could cause inadequate preheating of the larger components which would then result in incomplete soldering.

The aim of the present invention is to create a procedure and an arrangement whereby the temperature control is simplified and acts quickly, and in the case of thick printed boards bearing components of different sizes, flawless soldering of the large components is ensured without the smaller components becoming overheated.

According to the invention, this aim is fulfilled.

First of all, the procedure according to the invention basically provides for regulation of the exposure time, rather than the heat output, through adjustment of the conveyance speed; moreover, the conveyance speeds in the preheating zone and the soldering zone are independently adjustable, so that independent optimization of the two zones is possible.

To this end, the preheating zone is set at a constant preheat temperature just slightly below the melting temperature of the solder, at a level tolerable for all components, including the smaller ones; the conveyance speed in the preheating zone is adjusted so that the components with the largest heat capacity just reach the preheat temperature; this ensures that the printed-board assembly reaches the highest possible preheat temperature, thus greatly shortening the subsequent soldering time, without the smaller components becoming overheated, since these cannot reach a temperature above the preheat temperature.

Independent of the conveyance speed in the preheating zone, the conveyance speed in the soldering zone is set so that the solder for the component with the largest heat capacity just finishes melting. Since the procedure according to the invention ensures that all components have reached a preheat temperature just slightly below the melting temperature, the exposure time in the soldering zone can be kept extremely short, so that the smaller components are not overheated in the soldering zone.

According to an embodiment of the invention, the ambient temperature in the preheating zone is adjusted to the desired preheat temperature. The atmosphere in the preheating zone, which preferably consists of air but can also be a gas mixture, is heated to a given constant value with convector heaters, in the example. The printed board and components are heated by means of heat exchange between this atmosphere and the articles to be heated.

In another embodiment of the invention, the printed board and the components are heated to the melting temperature of the solder by means of radiant heaters provided in the soldering zone. These heaters can radiate considerable heat in spite of their compact size; thus the exposure time at the higher temperatures can be kept short and the danger of damage to electronic components avoided.

To ensure that changing ambient temperatures in the soldering zone do not distort the heating of the printed board and the components, the invention further provides for the ambient temperature in the soldering zone to be set at a maximum temperature in the vicinity of the melting temperature, but preferably just below this melting temperature. This way the atmosphere in the soldering zone essentially serves only to maintain the temperature reached in the preheating zone and does not help raise the temperature to the melting point. The ambient temperature in the soldering zone is best regulated by means of controlled hot-air suction ventilation and fresh air supply.

To accelerate the preheating of the printed board and components, another embodiment of the invention provides for preheating the printed board in two stages, first to a level below the preheat temperature, using a booster temperature higher than the preheat temperature; and then to the predetermined ultimate temperature of the preheating zone, using a temperature equivalent to the preheat temperature.

To implement the procedure using an arrangement with at least one preheating zone and a soldering zone, each equipped with heating elements and a conveyor system for the printed boards that runs through the preheating zone and the soldering zone in succession, the invention provides for this conveyor system to consist of an initial conveyer assigned to the preheating zone and a second conveyor assigned to the soldering zone, and for the conveyance speeds of these two conveyors to be independently adjustable.

The preheating and soldering zones are designed essentially as closed chambers, each having an entry opening and an exit opening for the respective conveyor, so that the conditions maintained in the chambers do not influence one other.

According to an embodiment of the invention, in order to maintain a particular ambient temperature in the soldering chamber, the chamber is equipped with a forced ventilation system triggered by a temperature probe that senses the consolute temperature in a suction device, so that the ambient temperature in the soldering chamber remains constant.

Additional features and advantages of the invention are brought out in the patent claims and the embodiment description.

Figure 2:
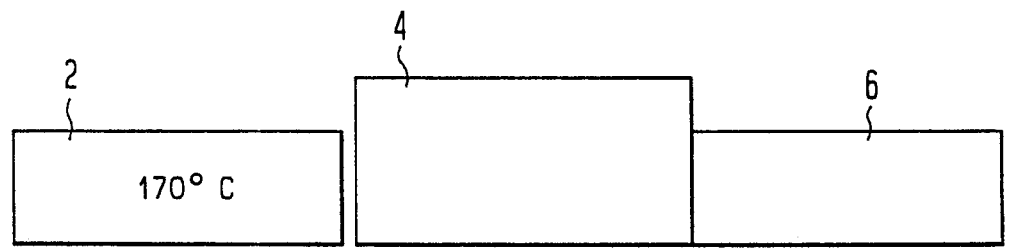
Figure 3:
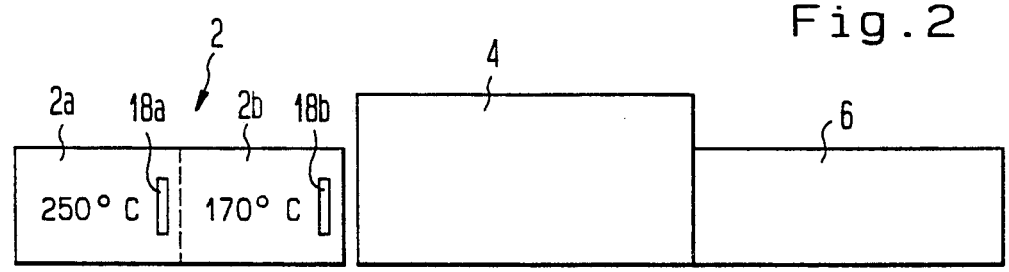
Figure 4:
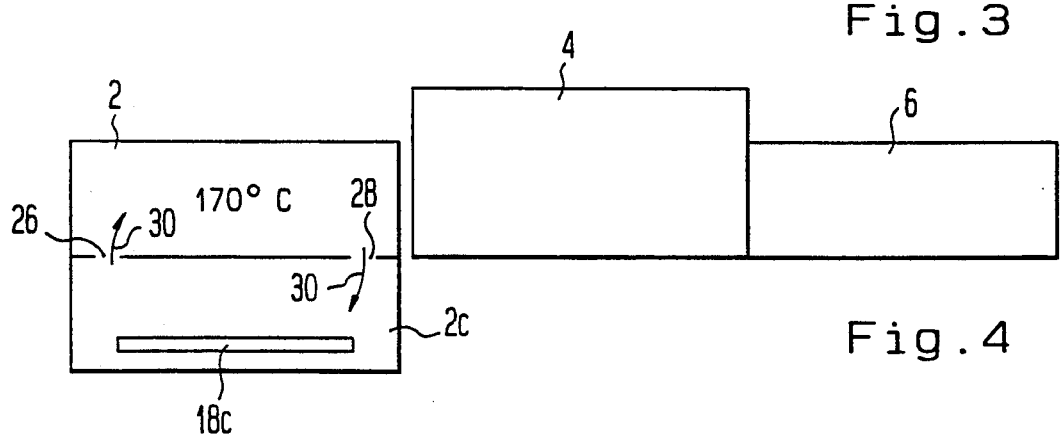
Figure 5:
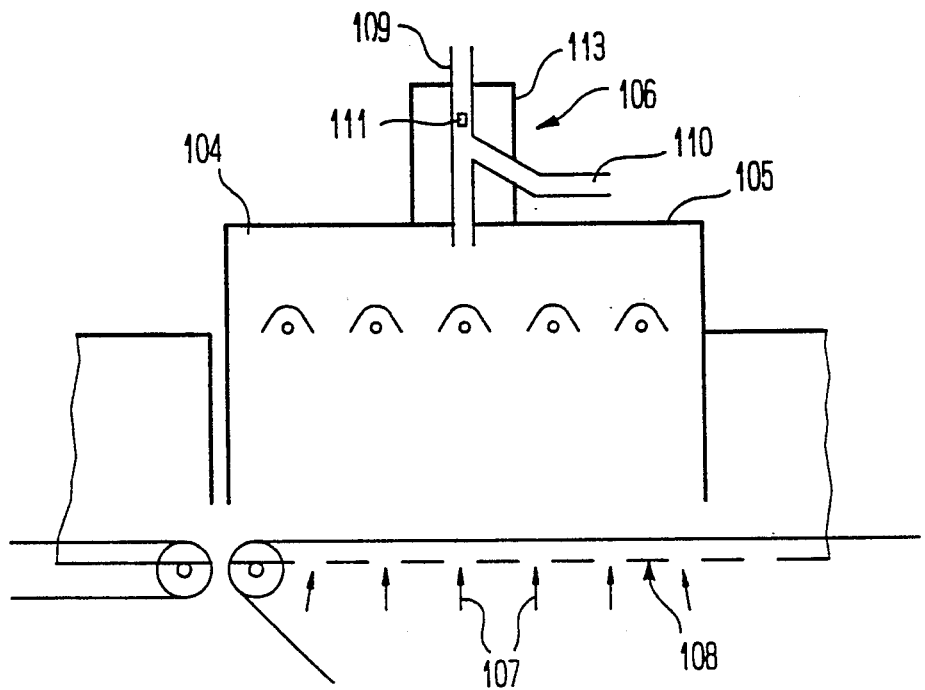
Figure 6:
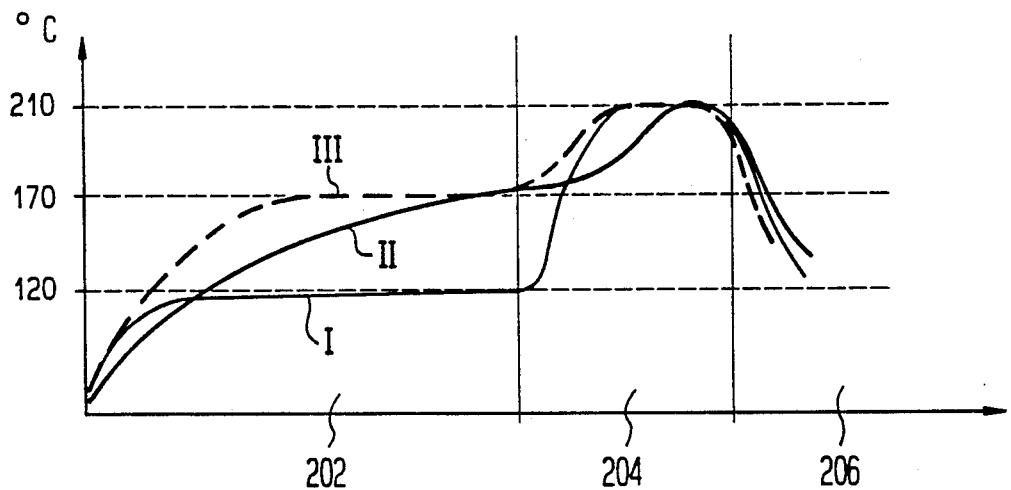

Several embodiments of the invention are shown in the drawings and described in detail below. Shown are:

FIG. 1 a schematic lateral view of a system having a preheating chamber and a soldering chamber, each with its own conveyor belt;

FIG. 2 the arrangement of FIG. 1 as a block diagram;

FIG. 3 another arrangement as a block diagram;

FIG. 4 yet another arrangement as a block diagram;

FIG. 5 a schematic view of a soldering chamber similar to that in FIG. 1, with a forced ventilation system;

FIG. 6 a temperature graph.

The system shown in FIG. 1 consists of a preheating chamber 2, a subsequent soldering chamber 4, and a cooling chamber 6 subsequent to the soldering chamber 4.

The preheating chamber 2 has its own conveyor 8 in the form of a conveyor belt, by which the printed-board assemblies 10 are conveyed through the preheating chamber 2 in the direction of the arrow 12.

The soldering chamber 4 likewise has its own conveyor 14, in the form of a conveyor belt, by which the printed boards 10 are conveyed through the soldering chamber 4 in the direction of the arrow 16. The beginning of conveyor 14 borders directly on the end of conveyor 8, so that the printed boards 10 are transferred from conveyor 8 to conveyor 14.

At the end of the soldering chamber 4 farthest from the preheating chamber, the conveyor 14 extends beyond this and through the cooling chamber 6 which follows the soldering chamber 4.

At the right end of the conveyor 14 in FIG. 1, the soldered printed boards 10 are removed.

The preheating chamber 2 is provided with convector heaters 18, electrical resistance heaters in the example, which heat the air in the preheating chamber to a given preheat temperature, as shown in detail in FIGS. 2–4. The preheat temperature is kept constant by control systems known in the art and not shown in detail here.

The soldering chamber 4 is provided with upper radiant heaters 20 and lower radiant heaters 22, embodied as infrared radiators in the example. These radiant heaters 20, 22 enable the printed boards 10 with their inserted electronic components to be brought quickly from just below the melting temperature of the solder to this melting temperature. So that the radiant heat from the lower heaters 22 can reach the printed boards 10, the floor of the soldering chamber 4 is embodied as a grid in the example, and the conveyor 14 as several narrow conveyor belts running side by side.

The cooling chamber 6 is equipped with ventilators 24, which cool the printed boards 10 emerging from the soldering chamber 4, so that the solder which bonds the components to the printed boards hardens.

As already described earlier and explained again with the help of FIG. 2, a constant ambient temperature just below the melting temperature of the solder is maintained in the preheating chamber 2; in the example, it is 170° C. The conveyance speed of the conveyor 8 is adjusted so that at the right end of the preheating chamber 2 in FIG. 1, the components with the largest heat capacity have just reached the preheat temperature of 170° C.; components with lower heat capacities reach the preheat temperature earlier, but they cannot reach temperatures any higher than the preheat temperature prevailing in the preheating chamber. This arrangement ensures that the printed board and all its components reach the preheat temperature without individual components being overheated.

The radiant heaters 20, 22 provided in the soldering chamber 4 operate at a constant heat output, which is calculated so that at the given conveyance speeds the melting temperature for the solder of the component with the greatest heat capacity can be reached at the right end of the soldering chamber 4 in FIG. 1. The conveyance speed of the conveyor 14 is then adjusted, according to the particular components on the printed board 10, so that the solder for the component with the largest heat capacity just finishes melting as it reaches the end of the soldering chamber 4.

The ambient temperature in the soldering chamber 4 is kept at a constant value below the melting temperature of the solder by appropriate means. This ensures that the printed board and its inserted components are essentially heated only by the radiant heaters 20, 22, whose heat output is regulated in a simple way, and not additionally by the ambient temperature in the soldering chamber 4, which may fluctuate. In the example, the ambient temperature in the soldering chamber 4 is set at 200° C.

The printed boards 10 are cooled in the cooling chamber 6, whereupon the solder hardens and the soldering process terminates. No special temperature control is required in the cooling chamber 6.

FIG. 3 shows an arrangement similar to that of FIG. 2 but in which the preheating chamber 2 is divided into a booster area 2a, with an ambient temperature of 250° C. in the example, and an subsequent area 2b in which the given preheat temperature of 170° prevails. The printed board is quickly heated to near the preheat temperature in the booster area 2a and then brought the rest of the way to the preheat temperature in the subsequent area 2b. This accelerates the preheating process, so that the conveyor 8 can run at a higher speed. Area 2a and 2b equipped with separate convector heaters, 18a and 18b respectively.

FIG. 4 shows an arrangement in which a heating chamber 2c housing the convector heaters 18c is provided below the preheating chamber 2. The heating chamber 2c is connected with the preheating chamber 2 via airflow openings 26 and 28, so that heated air can flow from the heating chamber 2c to the preheating chamber 2 and back, as indicated by the arrows 30. This prevents the heat radiating from the convector heaters 18c from impacting the printed boards or their inserted components and distorting the heating process in the preheating chamber 2.

FIG. 5 shows a soldering chamber 104, roughly corresponding to the soldering chamber 4 in FIG. 1. In order to keep the ambient temperature in the soldering chamber 104 constant, which is influenced by the heat radiating from the articles in the soldering chamber 104, printed boards and electronic components in the example, the ceiling 105 of the soldering chamber 104 is provided with a hot-air suction mechanism 106 for removing the hot air from the soldering chamber 104. The removed hot air is replaced by fresh air 107, which can flow in through the chamber floor 108, embodied as a grid in the example. The hot-air suction mechanism 106 consists of an exhaust pipe 109, and an ejector pipe 110 leading into it that blows compressed air into the exhaust pipe, so that an ejector effect causes hot air to be sucked through the exhaust pipe 109. The suction control is triggered by a temperature probe 111 provided in the outgoing air duct. The number 113 designates a protective housing surrounding the exhaust pipe 109.

FIG. 6 is a graph in which the temperature is represented on the ordinate and the progression of the printed boards through the preheating zone, the soldering zone and the cooling zone on the abscissa. The preheating zone 202 corresponds to the preheating chamber 201; the soldering zone 204 corresponds to the soldering chamber 4, and the cooling zone 206 to the cooling chamber 6 in FIG. 1.

Curve I describes the thermal progression of a component with a large heat capacity in a traditional system, whereby the printed boards move on a conveyor at a speed that is the same for all chambers and not individually adjustable. Since it is difficult to fine-tune the temperatures produced in the chambers, the printed board assemblies are heated to a relatively low preheat temperature in the preheating zone, and then heated to the melting temperature of the solder in the soldering zone. Particularly when the printed board carries components with different heat capacities, there is no assurance that all components will reach the same preheat temperature; then a major, sharp temperature increase is needed in the soldering zone 204, which places the components preheated to different temperatures at risk of being either overheated or incompletely soldered.

Curve II shows the thermal progression for components with large heat capacities in an arrangement according to the invention. The conveyance speed in the preheating zone 202 is adjusted so that the components with a large heat capacity reach a high preheat temperature of 170°, only slightly below the soldering temperature, just as they reach the end of the preheating zone 202; components with smaller heat capacities, whose thermal progression is shown by curve III, reach the preheat temperature of 170° earlier but cannot exceed it.

In the soldering zone 204, the speed of the conveyor is in turn set so that the solder for the components with large heat capacities, represented by curve II, just finishes melting at the end of the soldering zone 204; the components with smaller heat capacities reach the appropriate temperature earlier, as curve III shows, but because of the brief exposure to the radiant heaters, they are heated little, if any, above this temperature.

I claim:

1. A method of reflow-soldering for a printed circuit board assembly comprising a printed circuit board, a plurality of solder areas and a plurality of electronic components of differing heat capacities mounted in associated solder areas, the method comprising the steps of:

conveying the assembly through at least one preheating zone having a constant ambient preheat temperature and at a conveyance speed controlled such that a component having a larger heat capacity than other components just reaches a predetermined preheat temperature; and subsequently conveying the assembly through a soldering zone at a conveyance speed controlled such that solder in a solder area associated with the component with the larger heating capacity just finishes melting at the end of the soldering zone.

2. The method in accordance with claim 1 wherein the ambient temperature in the preheating zone is controlled to approach but not to reach the melting temperature of solder.

3. The method in accordance with claim 1 wherein the constant ambient temperature in the preheating zone is adjusted to be equal to the predetermined preheat temperature.

4. The method in accordance with claim 3 wherein the constant ambient preheat temperature is produced by convection heaters.

5. The method in accordance with claim 1 wherein the melting temperature in the soldering zone is produced by radiant heaters.

6. The method in accordance with claim 1 wherein the constant ambient temperature in the soldering zone is adjusted to a maximum temperature substantially equal to the melting temperature of the solder.

7. The method in accordance with claim 6 wherein the ambient temperature in the soldering zone is regulated by removing heated air and supplying cooler air.

8. The method in accordance with claim 1 wherein the constant ambient preheat temperature is maintained at approximately 170° C.

9. The method in accordance with claim 7 wherein the temperature of removed hot air is maintained at approximately 200° C.

10. The method in accordance with claim 1 and further comprising the step of conveying the assembly through an initial preheating area having a booster temperature higher than the constant ambient preheat temperature prior to the step of conveying the assembly through another preheating zone having a temperature equivalent to the ambient preheat temperature.

11. Apparatus for reflow-soldering of electronic components to a circuit board, comprising:

a soldering zone having a heater element adjusted to heat the circuit board to a predetermined temperature;

at least one preheating zone having a heater element adjusted to provide a selected ambient temperature in the preheating zone below the predetermined soldering temperature;

a first adjustable-speed conveyor in the preheating zone; and a second adjustable-speed conveyor in the soldering zone;

the speed of the first and second conveyors being independently adjustable.

12. The apparatus in accordance with claim 11 wherein the first and second conveyor devices are conveyor belts for carrying printed circuit boards.

13. Apparatus for reflow-soldering of electronic components to a circuit board, comprising:

at least one preheating zone and a soldering zone, each having a heater element;

a first adjustable-speed conveyor in the preheating zone; and a second adjustable-speed conveyor in the soldering zone;

the speed of the first and second conveyors being independently adjustable;

the preheating zone and the soldering zone comprising essentially closed chambers, each having a conveyor entry opening and a conveyor exit opening.

14. The apparatus in accordance with claim 13 wherein the heating element in the preheating chamber comprises at least one convection heater.

15. The apparatus in accordance with claim 13 wherein the preheating chamber comprises first and second consecutive zones, wherein the second zone is adjusted to a preheat temperature and wherein the temperature of the first chamber is adjusted to a booster temperature above the preheat temperature.

16. The apparatus in accordance with claim 13 and further comprising a heat chamber for housing convection heaters and connected to the preheating chamber via air-flow openings.

17. The apparatus in accordance with claim 13 and wherein the soldering chamber comprises radiant heaters.

18. The apparatus in accordance with claim 13 and wherein the soldering chamber comprises a forced ventilation system.

19. The apparatus in accordance with claim 18 and further comprising a temperature-sensing device for sensing the ambient temperature in the soldering chamber and wherein the forced ventilation system is controlled in accordance with the state of the temperature-sensing device.

20. The apparatus in accordance with claim 18 wherein the soldering chamber comprises openings for incoming air and the forced ventilation system comprises an air ejector.

21. The apparatus in accordance with claim 13 and further comprising a cooling chamber adjacent the soldering chamber and wherein the second conveyor passes through the soldering chamber and the cooling chamber.

* * * * *